United States Patent [19]

Hopp

[11] 3,938,062
[45] Feb. 10, 1976

[54] END FIRE SURFACE WAVE PIEZOELECTRIC TRANSDUCER

[75] Inventor: Theodore H. Hopp, Silver Spring, Md.

[73] Assignee: The United States of America as represented by the Secretary of the Army, Washington, D.C.

[22] Filed: Apr. 10, 1975

[21] Appl. No.: 567,048

[52] U.S. Cl.................... 333/30 R; 310/9.8; 333/72
[51] Int. Cl.².. H03H 9/02; H03H 9/20; H03H 9/26; H01L 41/10
[58] Field of Search ......... 333/30 R, 72; 310/8, 8.1, 310/8.2, 9.8

[56] References Cited
UNITED STATES PATENTS
3,831,044   8/1974   Speiser............................... 333/72 X

*Primary Examiner*—Alfred E. Smith
*Assistant Examiner*—Marvin Nussbaum
*Attorney, Agent, or Firm*—Nathan Edelberg; Robert P. Gibson; Saul Elbaum

[57] ABSTRACT

An acoustic surface wave transducer characterized by a novel electrode configuration. A pair of electrode strips are positioned on the surface of a piezoelectric material, each of the strips having elongate fingers extending laterally towards one another. The fingers from the opposed electrode strips are aligned with one another, as opposed to the common interdigitated structure of the prior art. The fingers have a prescribed spacing from adjacent fingers as well as from opposed fingers. The prescribed configuration causes the electric field between corresponding fingers to peak at the points between the ends of the fingers which, in turn, causes high shear stresses to occur and be reinforced as the acoustic wave travels down the length of the material. The basic transducer generates a point source of acoustic waves. An extension of the basic embodiment utilizes an array of transducers having electrode pairs in the prescribed configuration and which are configured with respect to one another so as to render the point sources additive which yields a plane wave front.

11 Claims, 3 Drawing Figures

END FIRE SURFACE WAVE PIEZOELECTRIC TRANSDUCER

RIGHTS OF THE GOVERNMENT

The invention described herein may be manufactured, used, and licensed by or for the United States Government for governmental purposes without the payment to me of any royalty thereon.

BACKGROUND OF THE INVENTION

1. Field of the Invention

This invention is related to microwave acoustics, and more particularly, is related to an improved electro-acoustic transducer structure for acoustic surface wave devices.

2. Description of the Prior Art

Well-known acoustic wave circuits include a source of rf signals, a smooth slab-like element or substrate of a material capable of propagating acoustic surface waves, and a load or utilization device. Electro-acoustic transducers are attached or held in close proximity to the substrate to convert the rf energy to surface waves in the material and vice versa. In general, acoustic surface wave device substrates are fabricated from piezoelectric materials. With such substrates, the input and output transducers commonly take the form of interdigitated electrode fingers bonded or held in close proximity to the substrate surface. Such an electrode array, which may also be described as composed of a pair of interleaved combs of conducting teeth, are coupled to the piezoelectric medium and are utilized to launch acoustic surface waves on that medium. Such acoustic surface waves, or Rayleigh waves are produced upon application of an electrical signal to one of the transducers. An electrical signal is then picked up by the other transducer after a delay equivalent to the time taken by the acoustic waves to propagate from one transducer to the other. Prior art patents of which I am aware which are exemplary of the interdigitated electrode structure include the following U.S. Pat. Nos.: 3,600,710; 3,663,899; 3,742,396; 3,748,603; 3,753,164; 3,790,828; 3,803,520; 3,831,044; and 3,516,027. Such structures may be utilized for various different components such as delay lines, amplifiers, attenuators, filters, and couplers, all having the advantage of micro-miniature construction techniques due to the considerably slower travel of acoustic surface waves than that of electromagnetic waves in free space. In the standard interdigitated transducer, the surface wave is generated by the interaction of the electric fields between the fingers and the material itself through the piezoelectric properties of the material, adjacent fingers being separated by half a wavelength. Details of operation are adequately described in some of the prior art patents, as well as in an excellent article by John deKlerk "Elastic Surface Waves," which appeared in PHYSICS TODAY, November, 1972, pages 32 through 39.

In the deKlerk article, it is explained that the piezoelectric properties of a material are defined by the piezoelectric matrix for that material, the matrix being a 3 × 6 array of the form:

$$(d_{ij}) = \begin{pmatrix} d_{11}\ d_{12}\ d_{13} & \vdots & d_{14}\ d_{15}\ d_{16} \\ d_{21}\ d_{22}\ d_{23} & \vdots & d_{24}\ d_{25}\ d_{26} \\ d_{31}\ d_{32}\ d_{33} & \vdots & d_{34}\ d_{35}\ d_{36} \\ \text{compression} & & \text{shear} \end{pmatrix}$$

The coefficients $d_{ij}(1 \leq j \leq 3)$ represent proportionality constants between the compressional stress and electric field components. The coefficients with $4 \leq j \leq 6$ represent the shear stresses produced by electric fields. The index $i$ refers to the crystallographic axes. The interdigital transducer of the prior art requires that there be non-zero off diagonal components in the shear half of the piezoelectric matrix in order for the surface waves to be generated.

However, due to the symmetry of many materials, all of the off-diagonal components in the shear portion of the matrix are zero, even though the material is piezoelectric. Zinc blende is one example of such a material. The only way one may utilize such materials with an interdigital transducer is to rotate the crystal so that the transducer is not aligned with one of the principal crystallographic axes. This rotation causes effective off-diagonal piezoelectric coefficients to appear. Some of these coefficients may then be utilized to generate surface waves. A problem with the latter approach is that excessive energy may be dissipated by generating unwanted acoustic waves due to inadvertent coupling through other effective coefficients that have appeared as a result of the rotation of the crystal.

It would therefore be extremely advantageous if a Rayleigh wave generator could be developed with a view towards utilizing those materials with simply non-zero diagonal components. This would open up a whole new class of heretofore unutilized materials for use as acoustic surface wave transducers.

SUMMARY OF THE INVENTION

It is therefore a primary object of the present invention to provide a novel acoustic surface wave device which permits the utilization of a piezoelectric material which has off-diagonal components in the shear portion of its piezoelectric matrix all of which are zero.

Another object of the present invention is to provide a novel and unique acoustic surface wave device which may utilize a piezoelectric material whose only requirement is that there exist non-zero on diagonal components.

An additional object of the present invention is to provide a novel and unique acoustic surface wave device for which a wide range of piezoelectric materials may be utilized which have heretofore been ignored in the primarily interdigital electrode structure utilized in conjunction therewith.

A further object of the present invention is to provide a novel acoustic surface wave transducer which generates a point source of acoustic surface waves.

A still further object of the present invention is to provide an acoustic surface wave transducer array in which a multiplicity of point-source acoustic surface waves may be combined in any desired manner to, for example, produce a plane wave, and end-fired array, a phased array, or the like.

The foregoing and other objects are attained in accordance with one aspect of the present invention through the provision of an acoustic surface wave device which comprises a substrate of a material capable of propagating acoustic surface wave energy, and at least one electro-acoustic transducer coupled to a region of a surface of the substrate. The transducer includes first and second sets of elongated electrode elements each having opened ends and being regularly spaced in a lateral direction. The open ends of the first set of elongated electrode elements substantially faces the open ends of the second set of electrode elements and are separated therefrom along a direction transverse to the lateral direction. Between the electrode elements of the first and second sets is connected electrical circuit means such as a source of rf energy, a load utilization device, or the like. The lateral distance between the centers of adjacent electrode elements of the first and second sets is approximately equal to one wave length of the acoustic surface wave energy launched or received at the elements. A further restraint is that the distance separating the ends of the facing sets of elements along the transverse direction be small relative to the adjacent electrode element distance. The net result is the generation of an electric field which is transverse to the direction of wave propagation and allows piezoelectric materials to be utilized which have non-zero diagonal components only. A single transducer endfires in that the surface wave propagates from one end of the electrode structure as a point source.

In accordance with another aspect of the present invention, a plurality of transducer structures are provided each individual transducer corresponding in geometry to the single transducer structure set forth hereinabove. The plurality of additional electro-acoustic transducers each include a pair of sets of elongated electrode elements coupled across a source of rf energy. One particular array combines the effective point sources of a plurality of transducers in order to generate a plane wave by having a distance between adjacent electrode element pairs equal to half a wavelength.

BRIEF DESCRIPTION OF THE DRAWINGS

The foregoing and other objects, aspects, uses, and advantages thereof will become more fully apparent and better understood when considered in connection with the following detailed description of the present invention viewed in conjunction with the accompanying drawings, in which.

DETAILED DESCRIPTION OF THE PREFERRED EMBODIMENTS

Figure 1:
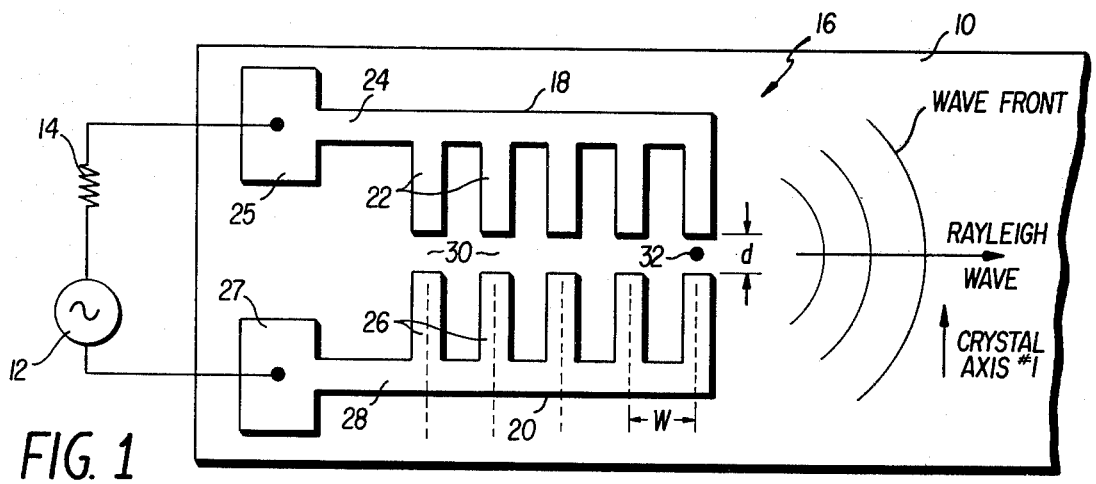
FIG. 1 is a plan view of a single acoustic wave transducer constructed according to a preferred embodiment of the present invention.

Referring now to FIG. 1, an acoustic surface wave device is shown fabricated on an elongated substrate 10. The substrate 10 is provided with an input transducer 16 adjacent one end, it being understood by a person of ordinary skill in the art that a like output transducer (not shown) is positioned adjacent the other end. A source of rf signals 12 is electrically coupled to input transducer 16, source 12 being in series with a resistor 14 which may represent the internal impedance thereof.

Input transducer 16 is seen to be comprised of an upper electrode 18 and a lower electrode 20. Upper electrode 18 includes a plurality of teeth 22 extending downwardly as shown from a common bus 24. Likewise, lower electrode 20 includes a plurality of teeth 26 which extend upwardly from a common bus 28. Busses 24 and 28 are respectively connected to input pads 25 and 27 which, in turn, receive the rf signal from source 12 as shown.

It is first noted that the opposing teeth 22 and 26 of the upper and lower electrodes 18 and 20, respectively, are not interdigitated, the open ends thereof respectively facing one another and leaving regions 30 formed between the tips thereof. As will be appreciated by a person of ordinary skill in the art, the electrode geometry depicted in FIG. 1 causes the electric field to be periodic along the length of piezoelectric material 10, and further causes the electric field to be concentrated, or have maxima, at the regions 30 between the adjacent tips of fingers 22 and 26.

Figure 2:
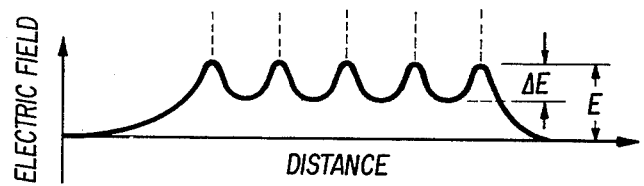
FIG. 2 is a graph showing the electric field variation over the device depicted in FIG. 1.

This may be seen more clearly in FIG. 2 which shows a plot of the electric field as a function of the position along the electrode structure of transducer 16. This plot illustrates the periodic nature of the electric field as well as the coincidence of the maximum peaks with the regions 30. The peaks in the electric field at the points between the ends of fingers 22 and 26 cause high shear stresses to occur in regions 30. The disturbances propagate outwardly from such points at the speed of sound in the material. If the applied signal frequency of source 12 is such that the wavelength of the signal in the material is equal to the adjacent electrode separation (W), the electric field will be reinforced when the disturbances have traveled a distance W.

The amount of reinforcement received by the signal during each cycle depends on the magnitude of the peaks ($\Delta E$) of the electric field along the signal path. This non-uniformity must be a large part of the total field strength E. Accordingly, the ends of the upper and lower teeth 22 and 26 of the electrodes 18 and 20 must be separated by a distance $d$ that is small compared to the adjacent finger separation W. If such a condition is met with the structure depicted in FIG. 1, the transducer 16 will serve as an approximate point source of surface wave radiation, which point source is designated in the drawing by reference numeral 32.

Figure 3:
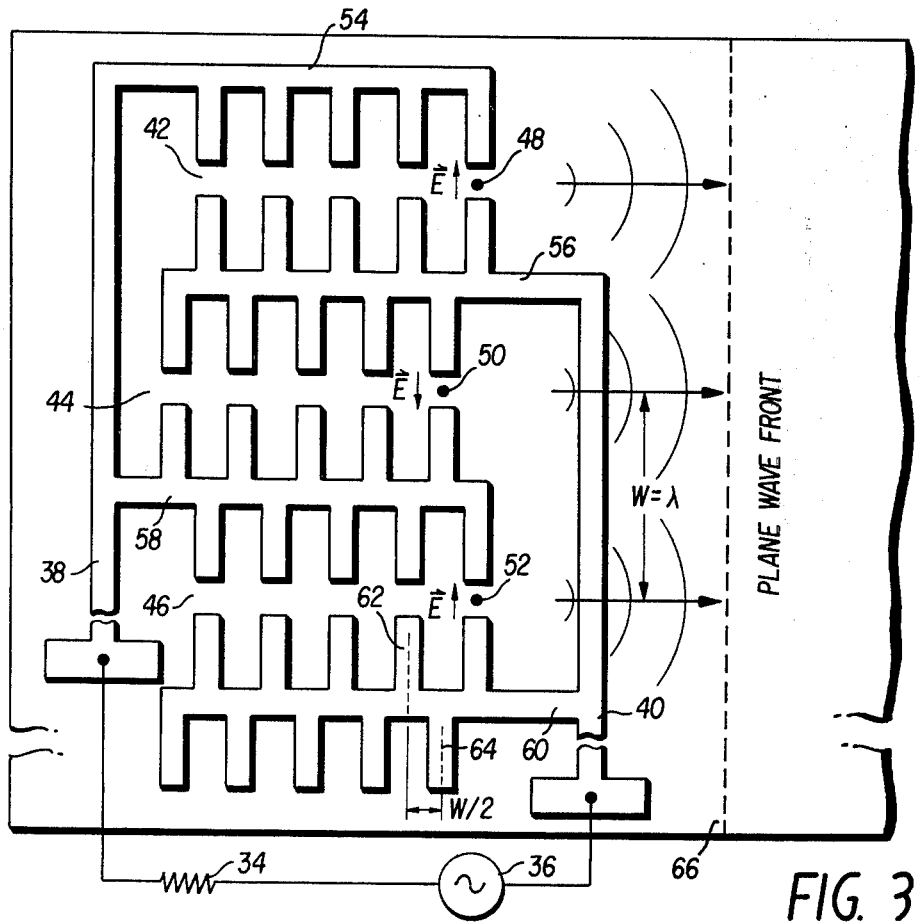
FIG. 3 is a plan view of an alternative preferred embodiment which illustrates an array of the transducers shown in FIG. 1 designed so as to generate a plane wavefront from a plurality of individual point sources.

If a plane wave is desired, rather than a wave emanating from a point source, the alternative embodiment depicted in FIG. 3 may be utilized. FIG. 3 illustrates a plurality of transducers 42, 44 and 46 which are mounted on a piezoelectric substrate 66. A pair of busses 38 and 40 are coupled by an rf signal source 36 in series with a resistor 34, as in FIG. 1. From bus 38 extends base electrode 54, and base electrode 58, while base electrodes 56 and 60 extend laterally from bus 40 as shown. It is again to be understood that FIG. 3 illustrates only one of the standard pair of acoustic devices commonly illustrated together, and it is understood that a receiving device connected across a utilization load may be identically configured to that shown in FIG. 3.

It is seen that base electrode 54 has a plurality of teeth extending downwardly therefrom which constitute the upper electrodes of transducer 42, the lower electrodes of which extend upwardly from base electrode 56. Similarly, the upper electrodes of transducer 44 extend downwardly from base electrode 56, the lower electrodes thereof extending upwardly from base electrode 58. Finally, the upper electrode fingers of transducer 46 extend downwardly from electrode member 58, while the lower electrodes thereof extend upwardly from base electrode 60.

The array of transducers 42, 44 and 46 create three point sources 48, 50 and 52, respectively, which combine to generate a plane wave by having the point source dimension of the radiating area $d$ much less than the wavelength. This is achieved, in FIG. 3, by separating transducers 42, 44 and 46 a distance of one wavelength (W) and by driving them in phase. Since the electric field between fingers of adjacent transducers, 42 and 44, for example, are oriented in opposite directions as shown in the drawing, adjacent electrode fingers must be placed half a wavelength out of phase spatially. This results in a net in-phase driven plane wave from the three point sources 48, 50 and 52, which obviously may be extended to a plurality of such point sources. In other words, adjacent point sources are electrically 180° out of phase and by placing alternate point sources a distance of half a wavelength back from the wavefront line, as seen in FIG. 3, this phase difference may be exactly canceled.

It is seen by virtue of the foregoing I have provided a novel electrode geometry which, by having the basic transducer aligned along a principal crystallographic axis, allows surface waves to be generated with a thin film transducer by coupling through the diagonal components of the shear half of the piezoelectric matrix. Such components are the same components that are generally useless to the conventional interdigitated transducers as discussed hereinabove. While the interdigitated structure may be more efficient in certain cases, since the active area is greater, the present structure may be made more compact since the length of the electrode fingers is not a working dimension. An additional advantage over the prior art interdigitated structure, over and above that provided by the availability of a number of additional piezoelectric materials having merely non-zero diagonal components, is that a number of point sources may be arranged in any fashion to, for example, provide phase variations, the generation of beams in different directions, switching functions and, as shown in FIG. 3, plane wave generation. The interdigitated structures generally only provide plane wave generation.

In addition to the standard piezoelectric materials having non-zero off-diagonal components, the following piezoelectric materials characterized by non-zero diagonal components may be utilized in accordance with the present invention as the substrate material:

any crystal in the group III-V compounds which usually crystallize in the cubic zinc blende structure;
gallium arsenide;
gallium phosphide;
aluminum phosphide;
indium antimonide;
aluminum antimonide;
sodium chlorate;
sodium bromate;

and the like. The arsenides, phosphides, and antimonides should be highly doped for high conductivity.

I wish it to be understood that I do not desire to be limited to the exact details of construction shown and described, for obvious modifications will occur to a person skilled in the art.

I claim as my invention:

1. An acoustic surface wave device, which comprises:
a substrate of a material capable of propagating acoustic surface wave energy;
at least one electro-acoustic transducer coupled to a region of a surface of said substrate; and
said transducer including first and second sets of elongated electrode elements having open ends and being regularly spaced along a first direction, each of said open ends of said first set of elongated electrode elements substantially facing one of said open ends of said second set of elongated electrode elements and being separated therefrom along a second direction which is substantially perpendicular to said first direction, the other ends of said first set of elongated electrode elements all being connected to a first common bus, the other ends of said second set of elongated electrode elements all being connected to a second common bus.

2. The device as set forth in claim 1 further comprising electrical circuit means coupled between the electrode elements of said first set and the electrode elements of said second set.

3. The device as set forth in claim 2 wherein the distance along said first direction between the centers of adjacent electrode elements of said first and second sets is approximately equal to the wavelength of acoustic surface wave energy launched or received at said adjacent electrode elements.

4. The device as set forth in claim 3, wherein the distance separating said ends of said two sets of elements along said second direction is small relative to said adjacent electrode element distance.

5. The device as set forth in claim 2, wherein said electrical circuit means comprises a source of rf signals.

6. The device as set forth in claim 4, further comprising a second electro-acoustic transducer which includes third and fourth sets of elongated electrode elements having said electrical circuit means coupled therebetween and open ends arranged with respect to each other in the same geometrical manner as the open ends of said first and second sets of elements.

7. The device as set forth in claim 6, wherein said third and fourth sets of electrode elements are separated along said first direction from said first and second sets of electrode elements a distance equal to half of said wavelength.

8. The device as set forth in claim 7, wherein the other ends of said second and third sets of electrodes are connected to said second common bus and extend from opposite sides thereof towards said first and fourth sets of electrodes, respectively.

9. The device as set forth in claim 4, further comprising a plurality of additional electro-acoustic transducers, each of which includes a pair of sets of elongated electrode elements, each pair having said electrical circuit means coupled therebetween and arranged with respect to each other in the same geometrical manner as between said first and second sets of elements.

10. The device as set forth in claim 9, wherein the distance along said first direction between the electrode element pairs of each of said additional transducers and the immediately adjacent transducer is equal to half of said wavelength.

11. The device as set forth in claim 10 wherein adjacent transducers share a common bus from which extends on opposite sides thereof two sets of electrode elements each of which respectively comprises one set of elements of the respective adjacent transducers.

* * * * *